United States Patent [19]

Gesemann et al.

[11] Patent Number: 5,501,876
[45] Date of Patent: Mar. 26, 1996

[54] PROCESS FOR THE MANUFACTURE OF PZT FILMS

[75] Inventors: Hans-Jürgen Gesemann, Chemnitz; Lutz Seffner, Dresden; Karin Völker, Weinböhla, all of Germany

[73] Assignee: MAN Roland Druckmaschinen AG, Offenbach am Main, Germany

[21] Appl. No.: 281,580

[22] Filed: Jul. 27, 1994

[30] Foreign Application Priority Data

Jul. 27, 1993 [DE] Germany ............ 43 25 167.6

[51] Int. Cl.⁶ ............................................. B05D 3/02
[52] U.S. Cl. .................................. 427/226; 427/126.3
[58] Field of Search ........................ 427/226, 126.3, 427/79

[56] References Cited

U.S. PATENT DOCUMENTS 4,812,426 3/1989 Takagi et al.
4,963,390 10/1990 Lipeles et al. ................ 427/110
5,116,643 5/1992 Miller et al. ................... 427/126.3
5,271,955 12/1993 Maniar ........................... 427/100

FOREIGN PATENT DOCUMENTS

0338799A3 10/1989 European Pat. Off.
0526048A1 2/1993 European Pat. Off.

OTHER PUBLICATIONS

Teowee et al, "Effect of Zr/Ti stoichiometry ratio on the ferroelectric properties of Sol–gel derived PZT films," ISAF '92, Proc. IEEE Int. Symp. Appl. Ferroelectr., 8th pp. 424–427, 1992.

*Primary Examiner*—Roy V. King
*Attorney, Agent, or Firm*—Cohen, Pontani, Lieberman, Pavane

[57] ABSTRACT

A process for producing PZT films on a substrate by thick-film technique in which the PZT films contain simply modified PZT and/or PZT with complex perovskite. PZT with a Zr content X of $X \geq X_p + 0.02 \leq X_p + 0.10$ is used, where $X_p$ is the Zr content of the base composition at the morphotropic phase boundary determined by the maximum coupling factor $K_r$.

6 Claims, 2 Drawing Sheets

PROCESS FOR THE MANUFACTURE OF PZT FILMS

BACKGROUND OF THE INVENTION

1. Field of the Invention

The invention relates to the fields of mechanical engineering and thick-film technique and, more particularly, is directed to a process for the manufacture of PZT films of the type that are used in coating printing cylinders.

2. Description of the Prior Art

Thin films based on lead zirconate titanate (PZT) are conventionally fabricated on various substrate materials including Si, $Al_2O_3$, $ZrO_2$, and so forth. The thin PZT films are used for memory applications or for other scientific purposes, and can be produced by various methods. The significant methods for producing such PZT films are the sputtering method and the sol-gel method. Films produced in these methods have a thickness in the range of 1 μm.

Thick films on substrate materials, such as $Al_2O_3$ substrates, do not as yet exist, although they have been the focus of interest. It might even be said that the methods of thick-film technique cannot be applied to PZT batches for reasons grounded in the properties of PZT.

Two obstacles prevent the use of PZT in thick-film techniques. On the one hand, the traditionally high sintering temperatures of approximately 1200° C. used when firing the films lead to a high lead oxide loss. This lead oxide loss tends to occur at the surface and leads to a complete change in the properties of PZT. On the other hand, difficulties arise due to the effect of transverse contraction. It is essential to the piezoelectric effect that an elongation is effected in the direction of polarization and in the field direction when voltage is applied. A transverse contraction occurs vertically to this effect. This means that the applied film contracts on the substrate, which can only take place within limits under conditions of firm adhesion. Forces resulting from this can be very large and lead to deformation of the substrate or chipping of the film.

SUMMARY OF THE INVENTION

Accordingly, it is the object of the present invention to prevent the evaporation of lead oxide and to prevent transverse contraction in PZT films so that PZT films can be applied to substrates by thick-film methods and so that firmly adhering piezoelectric films with a thickness of up to 300 μm can accordingly be produced.

Pursuant to this object and others which will become apparent thereafter, one aspect of the present invention resides in a process for producing PZT films on a substrate by thick-film technique. The fabricated PZT films contain simply modified PZT and/or PZT with complex perovskite. According to the invention, a PZT precursor is applied to a substrate, and, the PZT used has a Zr content X of $X \geq X_p+0.02 \leq X_p+0.10$, where $X_p$ is the Zr content of the base composition at the morphotropic phase boundary determined by the maximum coupling factor $K_r$. The PZT is then fired to covert the precursor into PZT film.

In an advantageous embodiment, a soft PZT with a remanent polarization $P_r$ at 50 Hz of $\geq 5$ μC/cm² is used as the PZT.

A PZT with a sintering temperature of $\leq 1050°$ C. is used in a further advantageous embodiment.

The simply modified PZT and/or PZT with complex perovskite used for the fabrication of PZT films according to the invention shows a tetragonal-rhombohedral (pseudocubic) morphotropic phase boundary as ternary system in the phase diagram. The position of this phase boundary can change quantitatively depending on composition, but the qualitative behavior remains constant. The piezoelectric data show a characteristic behavior in the vicinity of this morphotropic phase boundary. This characteristic behavior is determined in an S/X model system and is shown in FIGS. 1 and 2. These figures show that important piezoelectric characteristics such as the coupling factor $K_r$, the non-polarized dielectric constant $\epsilon_r$, the polarized dielectric constant $\epsilon^T_{33}$, thickness elongation $S_3$, transverse contraction $S_1$ and remanent polarization $P_r$ have a maximum in the vicinity of this phase boundary. This relationship is known per se.

However, it is entirely surprising that the transverse contraction $S_1$ in the rhombohedral region decreases rapidly in proportion to the thickness elongation $S_3$ resulting in a high anisotropic ratio A of greater than 7.

Furthermore, it is surprising that the remanent polarization $P_r$ remains relatively high parallel to the high anisotropic ratio with short-term poling. It is likewise surprising that the hysteresis curve at 50 Hz is almost identical to the hysteresis curve at 25 sec, so that the materials according to the invention can be poled extremely easily in the short-term range.

The various features of novelty which characterize the invention are pointed out with particularity in the claims annexed to and forming a part of the disclosure. For a better understanding of the invention, its operating advantages, and specific objects attained by its use, reference should be had to the drawing and descriptive matter in which there are illustrated and described preferred embodiments of the invention.

DETAILED DESCRIPTION OF THE PREFERRED EMBODIMENTS

Figure 1:
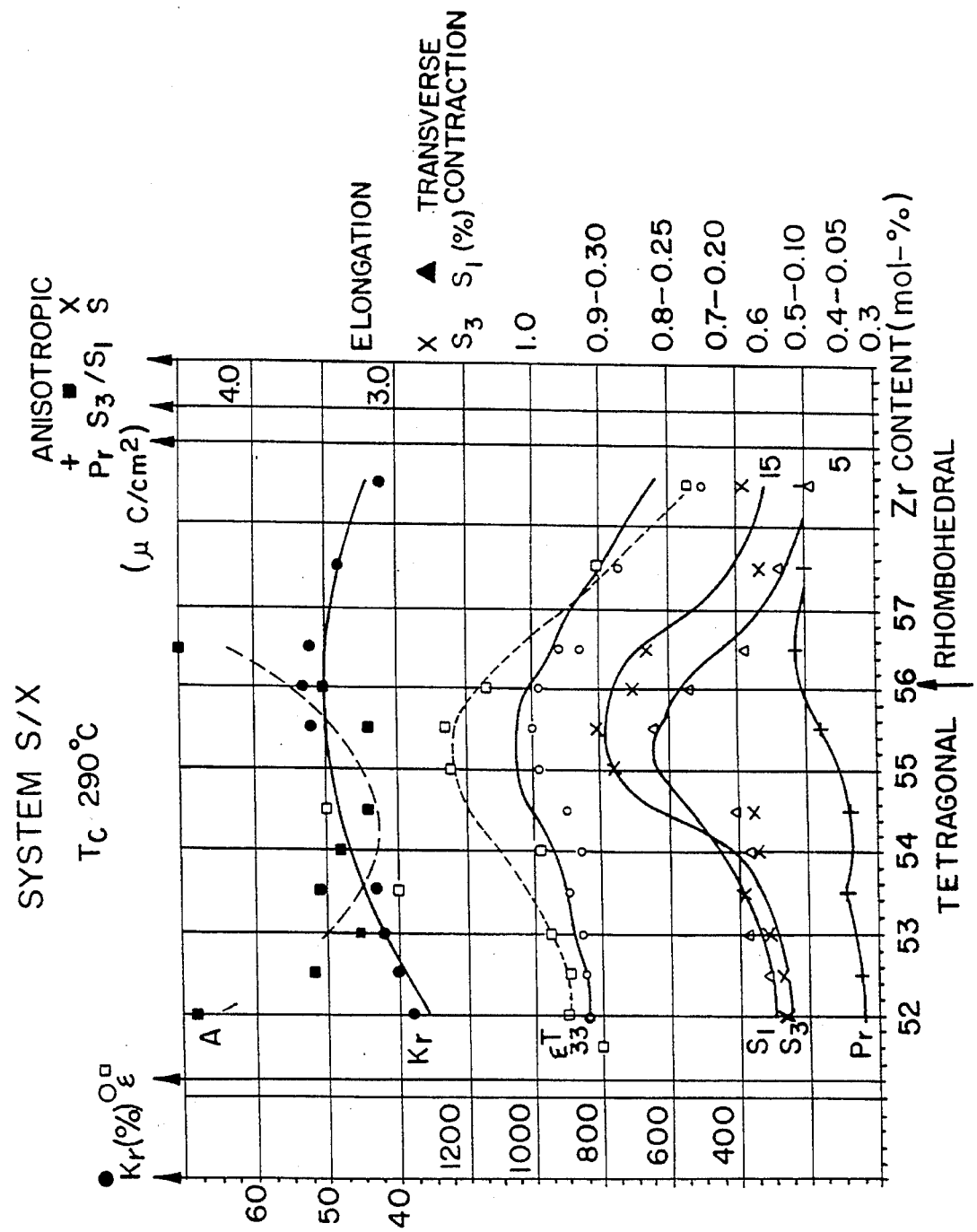
FIGS. 1 and 2 show the advantageous characteristics of the present invention jointly occurring around the phase boundary only within a narrow range in an S/X system.
Figure 2:
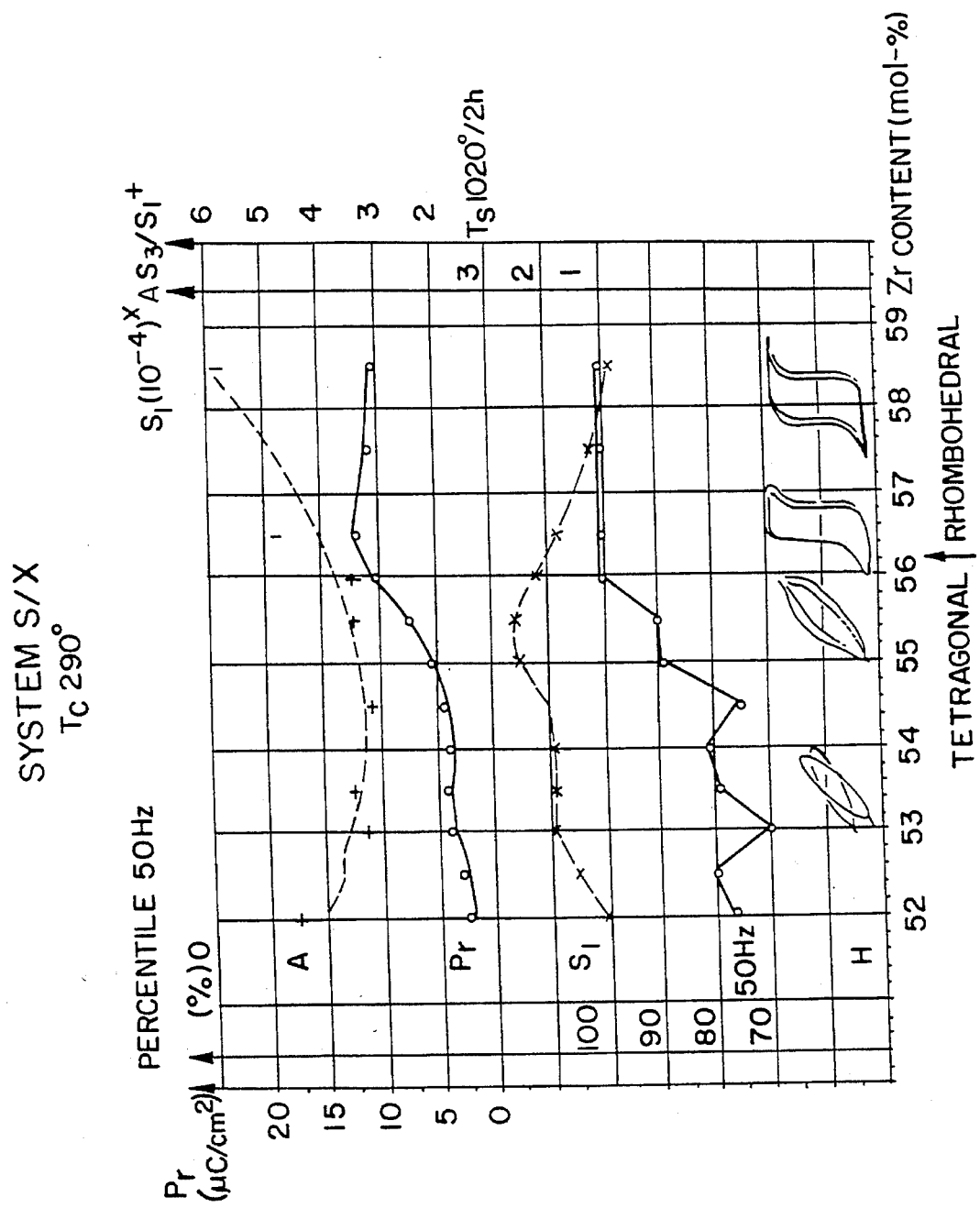

The invention is explained more fully below with reference to a specific embodiment.

A complex perovskite of the following composition:

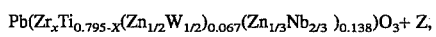

$$Pb(Zr_xTi_{0.795-X}(Zn_{1/2}W_{1/2})_{0.067}(Zn_{1/3}Nb_{2/3})_{0.138})O_3 + Z,$$

where Z is 1 wt.-% NiO and X is 42 mol-%, is applied in the form of a slurry or paste onto a substrate of $Al_2O_3$ and fired at 1050° C. for 1 hour, and is provided with a cover electrode or counter-electrode. The value of X was determined beforehand in that a plurality of batches of the complex perovskite with a content of X of 38.5 to 40 mol-%, offset by 0.5 mol-%, were produced and their coupling factor Kr was measured. The value of Kr reached a maximum at X=39.5 mol-%. At least 2 mol-% were calculated in addition and the value of X used in the batch was obtained.

The film produced in this way exhibited the following characteristics:

| | |
|---|---|
| $\epsilon^T_{33}$ | 800 |
| $P_r$ (static) | 10.7 μC/cm² (2 kV/mm control) |
| $P_{r50}$ (50 Hz) | 10.7 μC/cm² (2 kV/mm control) |
| coercive field strength | 800 V/mm |
| $S_3$ value | $5 \times 10^{-4}$ |
| transverse contraction $S_1$ | $8 \times 10^{-5}$ (measured on a disk) |
| adhesive strength | given by poling |

The invention is not limited by the embodiments described above which are presented as examples only but can be modified in various ways within the scope of protection defined by the appended patent claims.

We claim:

1. A process for producing a lead zirconate titanate (PZT) film on a substrate by thick-film technique in which the PZT films contain at least one of modified PZT and unmodified PZT, comprising the steps of: providing a substrate; applying a PZT precursor with a Zr content X of $X \geq X_p + 0.02 < X_p + 0.10$ onto the substrate, where $X_p$ is the Zr content of the base composition at a morphotropic phase boundary determined by a maximum coupling $K_r$; and firing the PZT precursor to convert the precursor into said PZT film.

2. A process according to claim 1, wherein the applying step includes applying a PZT precursor with a remanent polarization $P_r$ at 50 Hz of $\geq 5$ μC/cm².

3. A process according to claim 1, wherein the applying step includes applying a PZT precursor with a sintering temperature of $\leq 1050°$ C.

4. A process according to claim 1, wherein the applying step includes applying the PZT precursor as a slurry.

5. A process according to claim 1, wherein the applying step includes applying the PZT precursor as a paste.

6. A process according to claim 1, and further comprising the step of providing a cover electrode on the applied PZT film.

\* \* \* \* \*